United States Patent [19]
Kuo et al.

[11] Patent Number: 6,157,567
[45] Date of Patent: *Dec. 5, 2000

[54] UNLOCK BYPASS PROGRAM MODE FOR NON-VOLATILE MEMORY

[75] Inventors: Tiao-Hua Kuo; Eric Itakura, both of San Jose; May Xie, Cupertino; Nancy Leong, Sunnyvale, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/070,160

[22] Filed: Apr. 30, 1998

[51] Int. Cl.$^7$ ................................................... G11C 16/04
[52] U.S. Cl. ................................................... 365/185.04
[58] Field of Search .................. 365/185.04, 185.17, 365/185.33, 233; 395/559

[56] References Cited

U.S. PATENT DOCUMENTS

| | | | |
|---|---|---|---|
| 4,855,955 | 8/1989 | Cioaca | 365/185.17 |
| 5,361,343 | 11/1994 | Kosonocky et al. | 365/185.04 |
| 5,410,544 | 4/1995 | Kreifels et al. | 365/185.04 |
| 5,412,793 | 5/1995 | Kreifels et al. | 365/185.33 |
| 5,713,005 | 1/1998 | Proebsting | 395/559 |
| 5,881,002 | 3/1999 | Hamakawa | 365/185.04 |
| 5,995,424 | 11/1999 | Lawrence et al. | 365/233 |

*Primary Examiner*—Trong Phan
*Attorney, Agent, or Firm*—Fliesler Dubb Meyer & Lovejoy LLP

[57] ABSTRACT

The invention is directed to a single power supply pin non-volatile memory device that increases programming speed by providing for two-cycle programming. The invention maintains measures to prevent accidental user overwrites and maintains JEDEC standard compatibility. To provide for two-cycle programming, a three-cycle unlock bypass command is first sent, in one embodiment, after which a plurality of consecutive two-cycle program commands can be sent.

16 Claims, 6 Drawing Sheets

UNLOCK BYPASS PROGRAM MODE FOR NON-VOLATILE MEMORY

BACKGROUND OF THE INVENTION

1. Field of Invention

The invention is directed to the field of non-volatile memories. More particularly, the invention relates to write commands for use with a non-volatile memory array.

2. Description of Related Art

Figure 7:
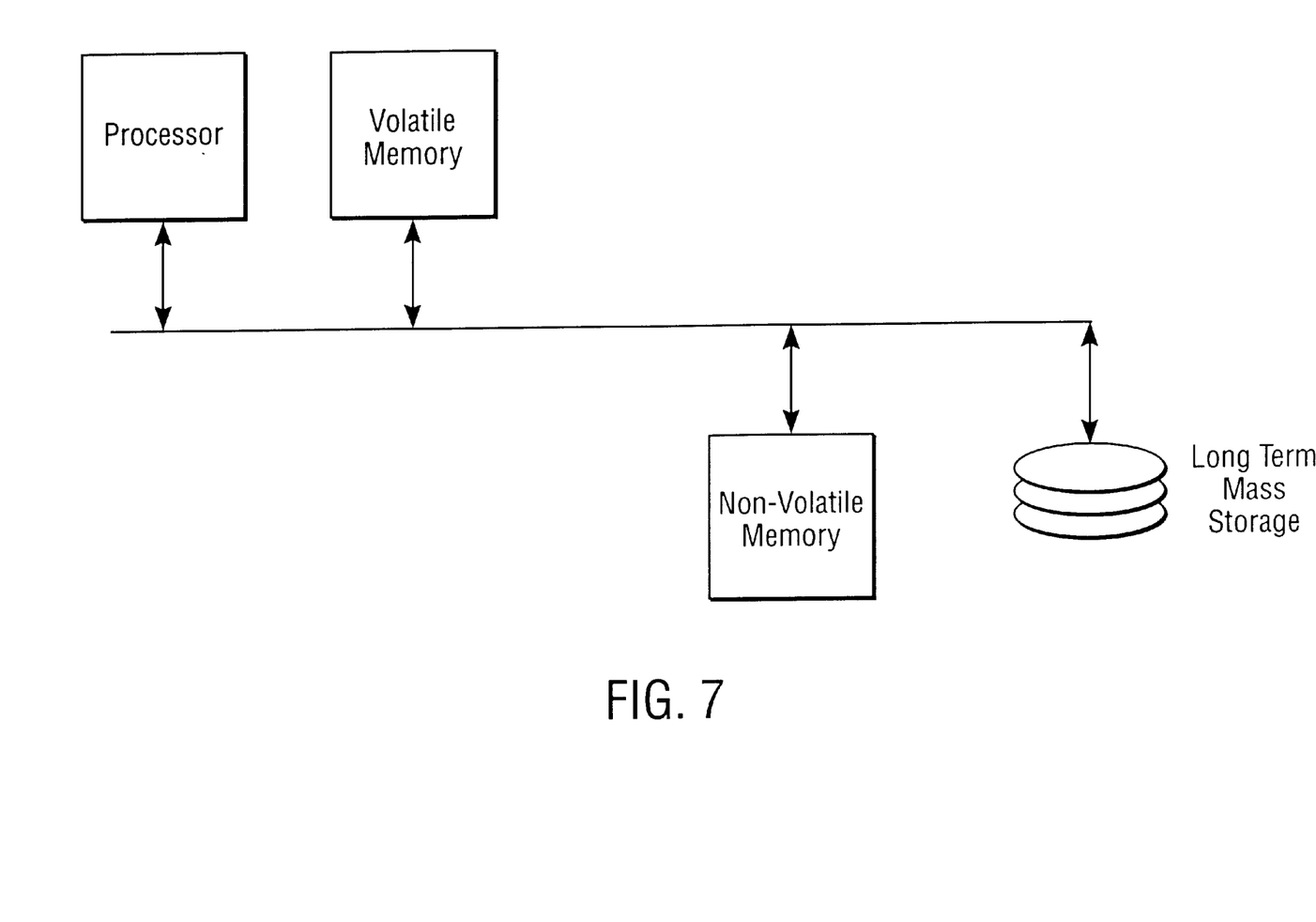
FIG. 7 is a generalized block diagram of an electronic system including volatile memory, non-volatile memory, and non-volatile mass storage.

Electronic systems typically include a processor and memory. The memory is used to store instructions and/or data. Memory can be "volatile" memory or "non-volatile." The information stored in a volatile memory is not maintained when the system is turned off. Thus, in some systems, such as that shown in the block diagram of FIG. 7, non-volatile memory is needed to guarantee that the data is continuously stored even when the system is turned off. Non-volatile memory includes mass storage devices such as disk drives as well as smaller storage devices such as ROMs. One type of ROM that is widely used is an EPROM. However, conventional EPROMS's cannot be reprogrammed once installed in an electronic system without removing the device from the system, and removal is typically not possible. Thus, many electronic designs use other devices such as EEPROMs or flash memories that can be reprogrammed in-system. Where cost is a factor, flash memories are typically chosen.

To perform various operations on a flash memory, including writing to the memory, a user must send commands to the memory. The commands indicate to the memory that a write operation (i.e., program or erase) or a multitude of other operations are to be performed. In order to assure compatibility between non-volatile memory devices, such as flash devices, and other electronic system devices, a set of standard commands have been developed. These standard commands are set out in the JEDEC Standard No. 21-C (Release 7), Configurations for Solid State Memories, § 3.5.3, incorporated herein by reference.

In order to operate, non-volatile memory devices such as flash memories require a voltage, Vcc, to be applied to at least one of the device's pins. Vcc is typically 5v, although it can be lower or higher. In addition to Vcc, which is required for read operations, many conventional devices require an additional high voltage, e.g., 12V, to be applied during a write operation that is not used during regular read operations. The requirement of such a high voltage serves to prevent accidental writing to the memory array (by the accidental sending of write commands) since this voltage will only be applied when the user desires to write to the memory device. In the interests of lowering the power consumption of flash devices and eliminating the requirement of two in-system power supplies, however, some companies have developed devices that can be written to using the same voltages as used for the read operations, e.g., Vcc=5v. Use of these "single power supply" memory devices has increased the risk of accidental overwrites of data stored in the memory.

For instance, one company that provides a single power supply memory device provides two power pins on its device. One pin is maintained at Vcc while the second pin is optionally brought to ground during read operations to prevent writes until the second power pin is raised again to Vcc. However, if the second pin is left at Vcc, there is no overwrite protection. Moreover, unless two power supply pins are provided, such protection is not even an option. Unfortunately, as with most electronic devices, pins are at a premium and the elimination of unnecessary pins is desirable. In addition, managing the control of an additional pin with such a critical single power supply function can significantly increase software complexity.

Hence, the JEDEC standard has included commands designed for single power supply memory devices so that a user cannot accidentally overwrite stored data by the accidental sending of write commands. Unfortunately, these security measures require that, for instance, every time a program operation is to be performed, a four cycle command sequence must also be performed. (For two-power-supply devices only two cycle command sequences are required). For each type of write command, program or erase, the first two cycles in the command sequence are "write unlock" cycles, indicating a write command is forthcoming and ensuring that the user indeed desires to write data to the memory cell array. The third cycle conveys the specific command for the operation, e.g., program. For a program operation, the fourth cycle in the command sequence indicates the specific address and data information to be programmed.

Each cycle is defined by a time period determined by external hardware and software. Typical write cycle times for currently available devices are approximately 200 ns–20 $\mu$s, where 200 ns is generally close to the shortest cycle time that these memory devices can support. Thus, since each program command sequence requires four write cycles under the JEDEC standard, the program command sequence will require at least 800 ns. Once the command is received, actual programming will take another 10 $\mu$s. Hence the program command sequence itself takes approximately 7.4% of the total programming time if a 200 ns cycle time is used. If using a 20 $\mu$s cycle time, total programming time for each byte of data increases to 90 $\mu$s, and the program command sequence takes 88% of total programming time. When programming over 1,000,000 bytes of data in a memory device, device programming times typically take 8–10s when using a 200 ns cycle time, but programming the same number of bytes with a 20 $\mu$s cycle time results in programming times of 96–110s. Clearly the command sequence cycles can have a large effect on the perceived program time. Moreover, for many companies that program many bytes of data in large numbers of devices using, for instance, specially designed programming equipment, reducing program command sequence cycle time could greatly enhance their productivity.

Because of the potentially excessive time required to program a device using the 4-cycle-per-byte (or -per-word) method outlined by the JEDEC standard when using longer cycle times, there is a need for a method of reducing write time to non-volatile memory devices while at the same time maintaining overwrite prevention measures and reducing pin count.

SUMMARY OF THE INVENTION

To overcome the above described problems, one embodiment of the invention, briefly described, is a single power supply non-volatile memory device that includes means for providing for two-cycle programming while maintaining measures to prevent accidental user overwrites and while maintaining JEDEC standard compatibility.

To provide for two-cycle programming, an embodiment of the invention first sends an unlock bypass command. The unlock bypass command is a three-cycle command sequence that includes the standard two-cycle write unlock sequence as well as a bypass command identifier. Once the device receives the unlock bypass command, it enters into a bypass mode via a state machine, permitting two-cycle programming until the mode is exited upon receipt of a bypass mode reset command.

The invention provides for faster programming times while at the same time, by requiring the unlock bypass command, prevents accidental overwrites. Further, because an embodiment of the invention also includes JEDEC standard commands, compatibility with other devices is maintained.

BRIEF DESCRIPTION OF THE DRAWINGS

The invention will be described with respect to particular embodiments thereof, and reference will be made to the drawings in which like numbers designate like parts and in which.

DETAILED DESCRIPTION

Figure 1:
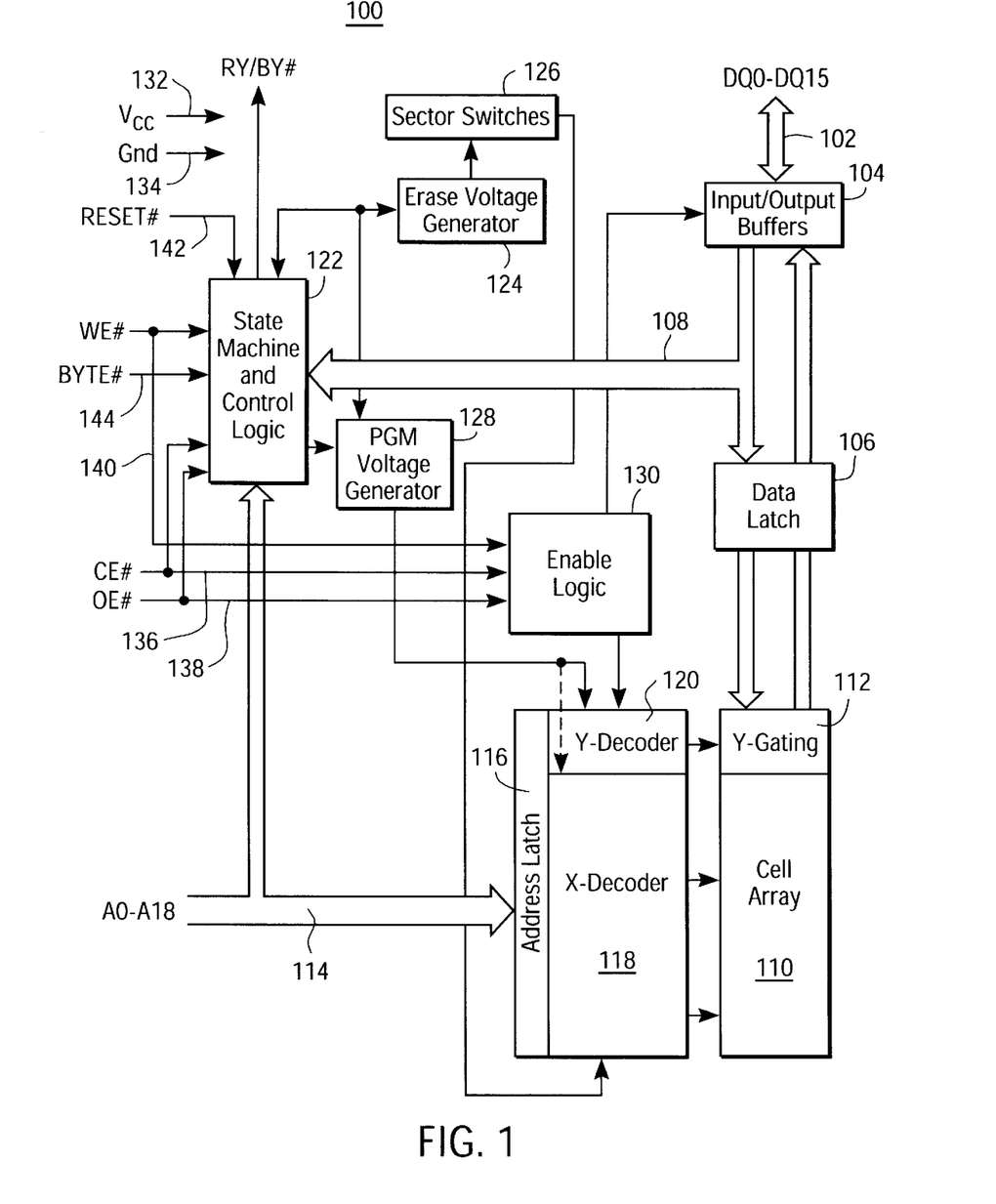
FIG. 1 is a generalized functional block diagram of a non-volatile memory in accordance with the invention.

FIG. 1 illustrates a functional block diagram of a non-volatile memory device 100 in accordance with the present invention. Data bus 102 carries data (DQ0–DQ15), which is received by Input/Output buffers 104. Input/Output buffers 104 in turn provide data to and receive data from data latch 106, which is in communication with cell array 110 via y-gating logic 112. Address bus 114 carries address information (A0–A18), which is latched by address latch 116. Address latch 116 is in communication with X- and Y-decoders 118 and 120, which in turn are coupled to cell array 110. Cell array 110 is where data is stored in memory device 100.

Data from Input/Output buffers 104 and address information from address bus 114 is also provided via bus 108 to State Machine and Control Logic 122. State Machine and Control Logic 122 also receives as inputs a Chip Enable (CE#) signal line 136, an Output Enable (OE#) signal line 138, a Write Enable (WE#) signal line 140, a Reset# signal line 142, and a BYTE# signal line 144. BYTE# signal line 144 is used to specify whether a byte of data or a word of data is to be read/written. When BYTE# is active (logic 0), only data bus pins DQ0–DQ7 are active and other data bus pins on bus 102 are tri-stated. When BYTE# is inactive (logic 1), all data bus pins DQ0–DQ15 are active. Although one embodiment of the invention can operate in either a word configuration (reading or writing words of data) or a byte configuration (reading or writing bytes of data), the description herein often focuses on the byte configuration. It is to be understood by those in the art, however, that either a word configuration or a byte configuration is suitable in various embodiments of the invention.

State Machine and Control Logic 122 provides signals to Erase Voltage Generator 124, which is coupled to sector switches 126, which are coupled to X-Decoder logic 118. State Machine and Control Logic 122 also provides signals to PGM Voltage Generator 128, which is in communication with X-decoder logic 118 and Y-decoder logic 120. Erase Voltage Generator 124 and PGM Voltage Generator 128 provide internally generated and regulated voltages for program and erase operations. Hence, as power signals, device 100 receives only Vcc 132 and Gnd 134. In other words, device 100 is designed for single power supply operation, and the user need not supply any other power supply voltages to perform read, program, and erase functions. Moreover, one embodiment of the invention requires only one pin for receiving Vcc. In one embodiment, Vcc is 1.8V–2.2V. In some other embodiments, Vcc=5v.

CE#, OE#, and WE# are also provided to Enable Logic 130. Enable Logic 130 provides signals to Input/Output Buffers 104 and to Y-Decoder logic 120.

One commercial embodiment of the invention is included in AMD's AM29SL800B 8 Megabit CMOS 1.8 volt-only Super Low Voltage Flash Memory, described in AMD publication #21545, Rev. A (February 1998), incorporated herein by reference.

The device functional operations are initiated through assertion of the CE#, OE# and WE# signals, according to the values indicated in Table 1 below.

TABLE 1

| Operation | CE# | OE# | WE# |
|---|---|---|---|
| Read | L | L | H |
| Write | L | H | L |

In Table 1, L represents a logical low value, e.g., GND, and H represents a logical high value, e.g., Vcc. In addition, the "#" sign used in conjunction with a signal name is used to indicate that the signal is active when it carries a logical low value. CE# is driven low to select the device 100. OE# is the output control and when active, allows data to be placed on the data bus as output (when inactive, data on data bus 102 is treated as input). When WE# is driven low, the device 100 is enabled for write operations. As used herein, the term "write" is used to indicate any command that alters the contents of the cell array 110, e.g., program or erase.

Thus, in accordance with Table 1, to read data from array 110, the device 100 must receive logical low signals on the CE# and OE# inputs, while WE# remains at a logical high. To write data to device 100, CE# and WE# must be driven low while OE# remains high.

Although the CE#, OE#, and WE# signals allow a device to be in a "write" state, an operation (e.g., program, erase) must still be specified by sending a command to the device. In one embodiment of the invention, the memory device 100 is configured to default to a read state. Hence, on power-up, device 100 will output data for reading in response to address information until it receives a command to perform a different operation. Command information is provided on the address and data lines. In accordance with the JEDEC standard for single power supply devices, a program command requires a four cycle command sequence as described in Table 2.

TABLE 2

Standard Program Command

| | first cycle | | second cycle | | third cycle | | fourth cycle | |
|---|---|---|---|---|---|---|---|---|
| | addr | data | addr | data | addr | data | addr | data |
| WORD | 555 | AA | 2AA | 55 | 555 | A0 | PA | PD |
| BYTE | AAA | AA | 555 | 55 | AAA | A0 | PA | PD |
| | write unlock cycles | | | | | cmd id | | |

Values specified in Table 2 are hexadecimal values and are for programming both bytes and words of information. In Table 2, the first two cycles define two "write unlock" cycles. In accordance with the JEDEC standard, these two sequential cycles precede almost every command, e.g., program, erase, reset, to prevent accidental overwrites of data. The third cycle specifies the particular operation to be performed by placing a particular command identifier on the data bus. As shown in Table 2, A0 on the data bus indicates a program operation is to be performed. Finally, the fourth cycle specifies the address (PA) and data (PD) information to be programmed. The State Machine and Control Logic 122 latches the command, address, and data information and utilizes the information provided to initiate and perform an embedded program algorithm, the details of which are unimportant for the present discussion.

In order to minimize time for programming, a method in accordance with the invention utilizes an alternate command sequence. An embodiment of the invention, however, additionally maintains the JEDEC standard command sequences and, hence, remains compatible with the JEDEC standard. In accordance with the invention, instead of utilizing a four cycle command sequence for every byte to be programmed, an "unlock bypass command" is first sent. The unlock bypass command requires a three-cycle command sequence as follows:

TABLE 3

Unlock Bypass Command

| | first cycle | | second cycle | | third cycle | |
|---|---|---|---|---|---|---|
| | addr | data | addr | data | addr | data |
| WORD | 555 | AA | 2AA | 55 | 555 | 20 |
| BYTE | AAA | AA | 555 | 55 | AAA | 20 |
| | Write unlock cycles | | | | | Cmd ID |

As with Table 2, values in Table 3 are hexadecimal values, as is customary in the art. The unlock bypass command sequence, as shown in Table 3, is initiated by first providing the two sequential write unlock cycles, as is done for most JEDEC standard commands such as the standard programming command described in conjunction with Table 2. Instead of specifying the program command identifier (A0), however, the third write cycle contains an unlock bypass command identifier 20 on the data bus.

Once the unlock bypass command has been received, the device enters an unlock bypass mode of operation. In the unlock bypass mode, information for programming is provided in a two-cycle program sequence as shown in Table 4.

TABLE 4

2-cycle Unlock Bypass Programming

| first cycle | | second cycle | |
|---|---|---|---|
| addr | data | addr | data |
| XXX | A0 | PA | PD |

The first cycle in the unlock bypass program sequence contains the command identifier A0 on the data bus, corresponding to the JEDEC standard programming command identifier that would generally be provided in the third bus cycle in a standard programming sequence (see Table 2). "XXX" on the address bus, indicates that the information on the address bus is "don't care" (i.e., it can be anything). The second bus cycle in the unlock bypass mode programming sequence contains address (PA) and data (PD) information for programming. While in the unlock bypass mode, subsequent data and address information is specified for programming simply by providing the sequence specified in Table 4. In other words, once the initial unlock bypass command sequence is asserted, only two cycles are required for programming. The unlock bypass mode dispenses with (or "bypasses") the initial two write unlock cycles required in the JEDEC standard program command sequence, resulting in faster total programming time while at the same time preventing accidental overwrites by requiring a three cycle unlock bypass sequence. As with the standard programming command, the State Machine and Control Logic 122 latches the command, address, and data information and utilizes the information provided to initiate and perform an embedded program algorithm.

Figure 2:
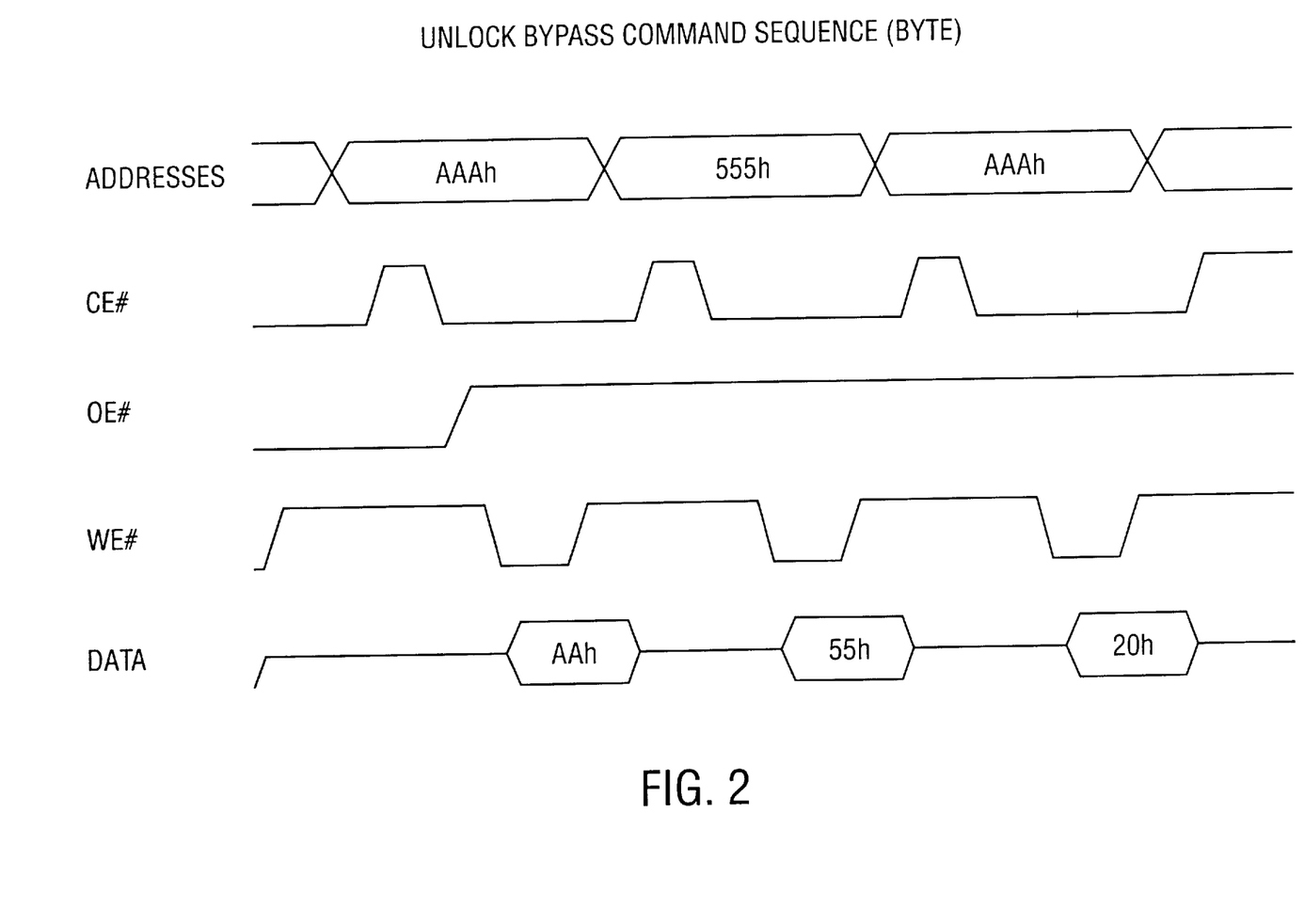
FIG. 2 is a timing diagram of an unlock bypass command sequence in accordance with the invention.
Figure 3:
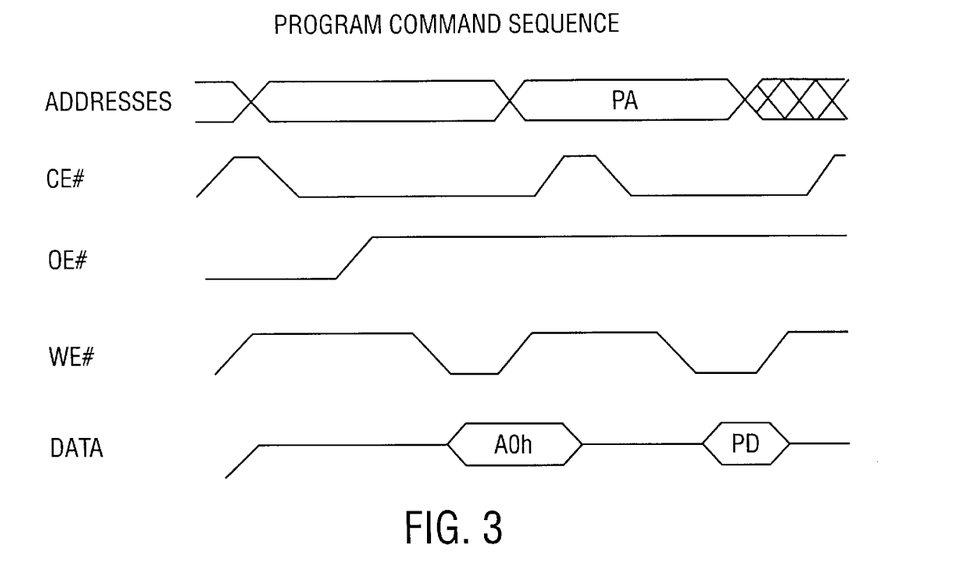
FIG. 3 is a timing diagram of a two-cycle program command sequence in accordance with the invention.
Figure 4:
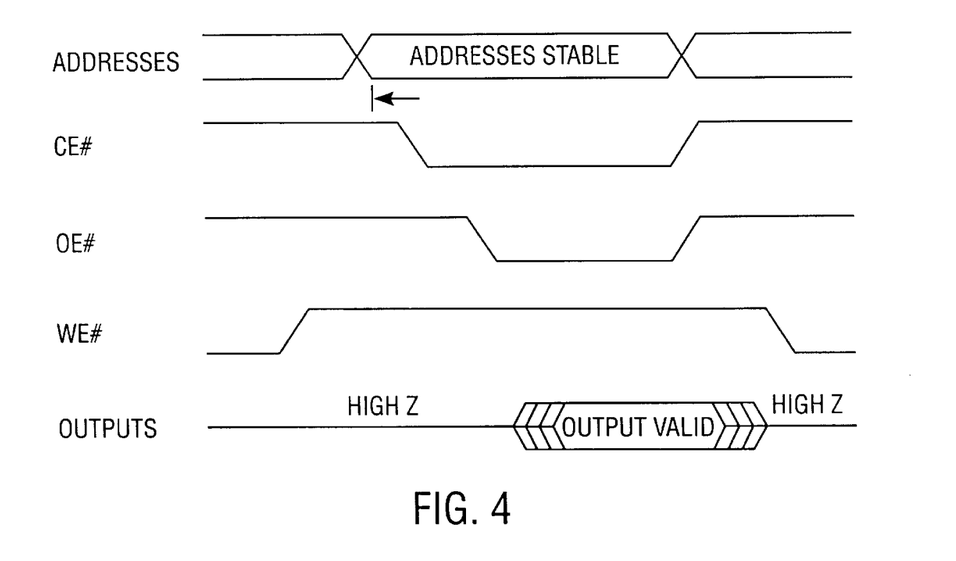
FIG. 4 is a timing diagram of a read cycle performed by an embodiment of the invention.

Timing diagrams of the unlock bypass command sequence and the two cycle program command sequence of Table 4 are shown in FIGS. 2 and 3, respectively. The two cycle program sequence (FIG. 3) is similar to the third and fourth cycles of a JEDEC standard program sequence (Table 2). A timing diagram of a read operation is also shown in FIG. 4. For each of the operations, shown in FIGS. 2–4, all addresses are latched on the falling edge of WE# or CE#, whichever happens later, in one embodiment. All data is latched on the rising edge of WE# or CE#, whichever happens first.

To exit the unlock bypass mode, the system issues a two-cycle unlock bypass reset command sequence as specified in Table 5, below:

TABLE 5

Unlock Bypass Reset Command

| first cycle | | second cycle | |
|---|---|---|---|
| addr | data | addr | data |
| XXX | 90 | XXX | 00 |

The first cycle in the Unlock Bypass Reset command sequence contains the data 90 (Table 5 values are hexadecimal). The second cycle contains the data 00. In both cycles, the address information is "don't care". After receiving the Unlock Bypass Reset command sequence, the device returns to the read state.

Figure 5:
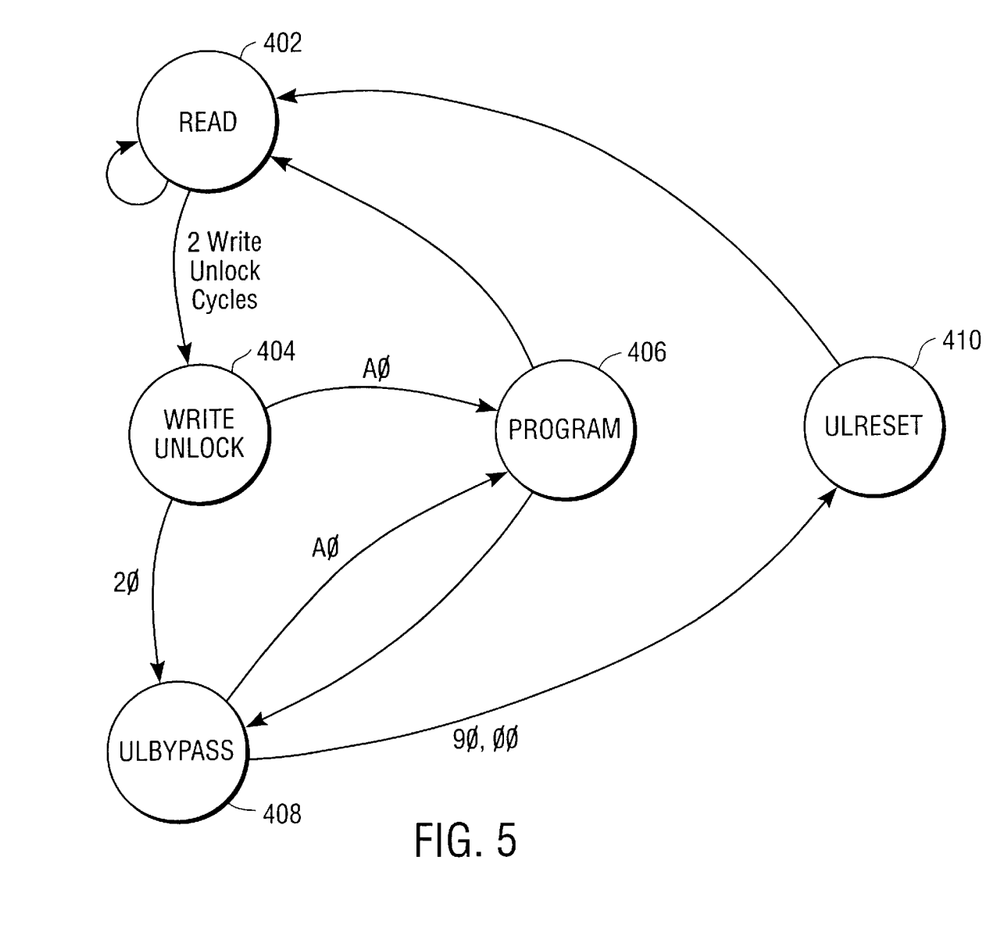
FIG. 5 is a state diagram illustrating some of the states of a non-volatile memory in accordance with the invention.

A state diagram is shown in FIG. 5 illustrating the states implemented by State Machine and Control Logic 122. As shown in FIG. 5, State Machine and Control Logic defaults to a READ state 402. Upon receiving the appropriate sequential write unlock cycles, the State Machine enters a WRITE UNLOCK state 404. If the appropriate write unlock sequence is not received, the system returns to the read state 402. Once in the WRITE UNLOCK state 404, if the next cycle specifies a program command identifier (A0), the device enters the PROGRAM state 406. Once the address and data is received in the PROGRAM state, the device will initiate memory array programming and, upon successful completion, will return to the READ state 402.

If, once in the WRITE UNLOCK state, the device receives in the next cycle an unlock bypass command identifier (20), the device enters the ULBYPASS state 408. If the next cycle receives A0 on the data bus, the device enters the PROGRAM state 406. Once programming of the specified address and data is complete, the device returns to the ULBYPASS state 408. Upon receipt of A0 on the data bus again, the device enters the PROGRAM state and subsequently returns to the ULBYPASS state. The device can continue to repeat these state changes (ULBYPASS-PROGRAM, PROGRAM-ULBYPASS) until the unlock bypass reset command is received while in the ULBYPASS state. Once the unlock bypass reset command is received, the device enters the ULRESET state 410 and then returns to the READ state 402.

Although the state diagram of FIG. 5 shows two different appropriate states to which the device can transition from the ULBYPASS state, in other embodiments other states will also be appropriate. For instance, in some embodiments an ERASE state, or other write state, may be appropriate to transition to from ULBYPASS.

Figure 6:
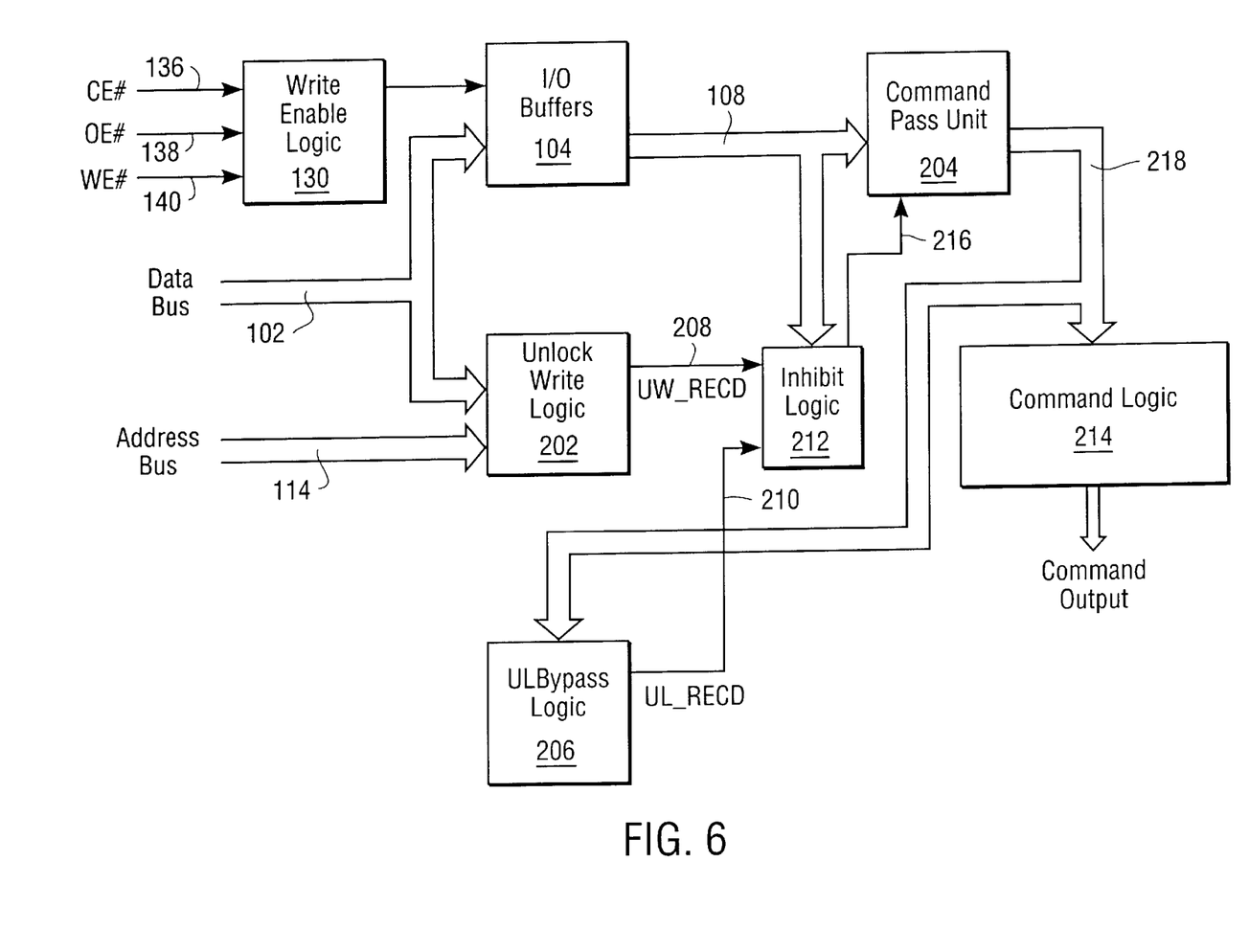
FIG. 6 is a generalized functional block diagram of a portion of state machine and control logic 122 in accordance with the invention.

To implement the state diagram of FIG. 5, one embodiment of the invention operates according to the simplified functional block diagram of FIG. 6. As shown in FIG. 6, when write enable logic 130 receives the appropriate combination of CE#, OE#, and WE# to indicate a write condition, it provides a signal to input/output buffers 104, allowing the buffers to receive input data from data bus 102 and hence receive command information. Simultaneously, unlock write logic 202 monitors address bus 114 and data bus 102 for unlock write cycles. When unlock write logic 202 receives two consecutive cycles containing data that matches that shown for the first and second cycles in Table 2, unlock write logic 202 sends a UW_RECD signal on line 208 to inhibit logic 212. Upon receipt of an active UW_RECD signal, inhibit logic 212 activates a "command pass open" signal on line 216 to command pass unit 204 if the data on bus 108 is a valid command identifier. In one embodiment, command pass unit comprises shift registers. The command pass open signal "opens" command pass unit 204, allowing unit 204 to receive, via bus 108, the data provided in the third cycle and output that data on lines 218.

During a standard programming operation, an active command pass open signal enables command pass unit 204 to receive the third cycle command identifier, indicating the operation to be performed, and, in the case of a programming operation, to receive the address and data information provided in the fourth cycle. The information is then provided to command logic 214. Command logic 214 processes command information received via lines 218 and outputs signals to other elements of the memory device to carry out the respective commands. The "command pass unit" thus allows the command information to pass through only in certain conditions. Other embodiments could use devices other than shift registers as a command pass unit.

The outputs of the shift registers 204 are also coupled via bus 218 to ULBYPASS Logic 206. When the command identifier received by the command pass unit 204 is the unlock bypass command identifier (20), the ULBYPASS Logic 206 asserts a UL_RECD signal on line 210 to inhibit logic 212. When inhibit logic 212 receives the UL_RECD signal, it outputs a continuous command pass open signal on line 216, causing the command pass unit to remain open to receive data regardless of whether the write unlock logic 202 has detected the unlock write cycles. The information received by unit 204 is provided to command logic 214. The UL_RECD signal to the command pass unit 204 is sustained by the ULBYPASS Logic 206 until the unit 204 receives the "unlock bypass reset" command sequence, at which time the ULBYPASS Logic 206 deasserts the UL_RECD signal on line 210.

A non-volatile memory device has thus been described that enhances programming times by minimizing the number of cycles required for a program command sequence, while at the same time, keeping in place barriers to a user's accidental overwriting of data. The memory device in accordance with the invention further requires only a single power supply pin in addition to ground and conforms with the JEDEC standards. For instance, one embodiment of the invention can receive program commands as either the 4-cycle program command shown in Table 2 or can enter the unlock bypass mode as specified herein.

While the device has been described with respect to flash devices, the principles of the present invention can be applied to other memory devices, as will be recognized by those of skill in the art. Moreover, while the invention has also been described primarily with respect to programming functions, there is no reason why the principles of the present invention could not be applied to other functions, e.g., erase, especially for devices that allow erasure of specified cells.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A non-volatile memory device, comprising:
   a single power solution pin in addition to one or more ground pins; and
   means for providing two-cycle programming while maintaining measures to prevent accidental user overwrites, said means for providing two-cycle programming including a state machine wherein said state machine includes the states READ, WRITE UNLOCK, PROGRAM, and ULBYPASS, and wherein said state machine transitions from said READ state to said WRITE UNLOCK state upon receipt of a write unlock command, wherein said state machine transitions from said WRITE UNLOCK state to said ULBYPASS state upon receipt of an unlock bypass command, and wherein said state machine can repeatedly transition from said ULBYPASS state to said PROGRAM state and back to said ULBYPASS state to program multiple units of information without having to again transition to said WRITE UNLOCK state.

2. A non-volatile memory, comprising:
   an address bus and a data bus;
   a command pass unit having an input coupled to receive data carried on said data bus and having an output;
   unlock write cycle logic in electrical communication with said address bus and said data bus and having an output for carrying a signal for initiating a command pass open signal to open said command pass circuitry, thereby allowing data received on said command pass unit input to be passed to said command pass unit output; and unlock bypass logic having an output for carrying a signal to sustain said command pass open signal upon receipt of an unlock bypass command.

3. The non-volatile memory of claim 2, wherein said address bus and data bus carry command information, and wherein said unlock write cycle logic activates said signal for initiating a command pass open signal upon receiving write unlock cycles from said address and data busses.

4. The non-volatile memory of claim 3, wherein said command pass unit receives said command information upon receipt of said command pass open signal, said command pass unit having a command output for carrying said command information;

unlock bypass logic in electrical communication with said command pass output.

5. An electronic system, comprising:

a processor; and a non-volatile memory in electrical communication with said processor, said non-volatile memory capable of operating in a first standard programming mode of operation and a second unlock bypass programming mode of operation, said second unlock bypass programming mode of operation resulting in faster programming than said first standard programming mode.

6. The electronic system of claim 5, wherein said non volatile memory is a single power supply non-volatile memory.

7. The electronic system of claim 5, wherein said second unlock bypass programming mode of operation includes programming using two-cycle programming command sequences while maintaining measures to prevent accidental overwrites and while maintaining JEDEC standard compatibility.

8. A process for writing to a non-volatile memory device, said non-volatile memory device capable of responding to standard write commands that include at least one unlock write cycle, comprising the sequential steps of:

providing an unlock bypass command to said non-volatile memory device, eliminating the need for unlock write cycles for subsequently provided write commands; and providing a plurality of write commands to said non-volatile memory device.

9. The process of claim 8, wherein said unlock bypass command includes:

a three cycle command sequence including two sequential unlock write cycles and a third command identifier cycle.

10. The process of claim 9, wherein said write commands each include a two cycle command sequence, wherein one of said two cycles includes address and data information to be written.

11. The process of claim 10, further comprising the step of:

providing an unlock reset command after said step of providing a plurality of write commands.

12. The process of claim 11, further comprising the steps of providing a JEDEC standard command sequence to said non-volatile memory device.

13. The process of claim 12, wherein said JEDEC standard command sequence includes a four-cycle write command, wherein said four cycle write command includes two unlock write cycles.

14. A computer readable medium having instructions stored thereon, which when executed by a processor in an electronic system supporting a non-volatile memory device, said non-volatile memory device capable of responding to standard write commands that include at least one unlock write cycle, cause the electronic system to perform the steps of:

providing an unlock bypass command to said non-volatile memory device, eliminating the need for unlock write cycles for subsequently provided write commands; and providing a plurality of write commands to said non-volatile memory device.

15. The computer readable medium of claim 14 wherein:

said unlock bypass command includes a three cycle command sequence including two sequential unlock write cycles and a third command identifier cycle; and said write commands each include a two cycle command sequence, wherein one of said two cycles includes address and data information to be written.

16. The computer readable medium of claim 15 further including instructions that cause the electronic system to perform the steps of:

providing a JEDEC standard command sequence to said non-volatile memory device.

* * * * *

UNITED STATES PATENT AND TRADEMARK OFFICE
CERTIFICATE OF CORRECTION

| | |
|---|---|
| PATENT NO. | : 6,157,567 |
| DATED | : December 5, 2000 |
| INVENTOR(S) | : Kuo et al. |

It is certified that error appears in the above-identified patent and that said Letters Patent is hereby corrected as shown below:

Column 8, claim 1,
Line 42, delete "solution" and insert -- supply -- therefor.

Signed and Sealed this

Twenty-fifth Day of September, 2001

*Attest:*

NICHOLAS P. GODICI
*Attesting Officer* — Acting Director of the United States Patent and Trademark Office